(12) United States Patent
Lee et al.

(10) Patent No.: US 11,901,023 B2
(45) Date of Patent: *Feb. 13, 2024

(54) ARCHITECTURE AND METHOD FOR NAND MEMORY OPERATION

(71) Applicant: Yangtze Memory Technologies Co., Ltd., Hubei (CN)

(72) Inventors: Changhyun Lee, Wuhan (CN); Xiangnan Zhao, Wuhan (CN); Haibo Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/945,783

(22) Filed: Sep. 15, 2022

(65) Prior Publication Data

US 2023/0020789 A1 Jan. 19, 2023

Related U.S. Application Data

(63) Continuation of application No. 17/191,768, filed on Mar. 4, 2021, now Pat. No. 11,468,957, which is a
(Continued)

(51) Int. Cl.
*G11C 16/34* (2006.01)
*G11C 16/04* (2006.01)
(Continued)

(52) U.S. Cl.
CPC ...... *G11C 16/3459* (2013.01); *G11C 16/0433* (2013.01); *G11C 16/10* (2013.01); *G11C 16/26* (2013.01); *G11C 16/30* (2013.01)

(58) Field of Classification Search
CPC . G11C 16/3459; G11C 16/0433; G11C 16/10; G11C 16/26; G11C 16/30
(Continued)

(56) References Cited

U.S. PATENT DOCUMENTS 10,665,299 B1   5/2020   Lu
10,861,537 B1   12/2020  Lien
(Continued)

FOREIGN PATENT DOCUMENTS

CN   111180418 A   5/2020
CN   111279455 A   5/2020
CN   111758162 A   10/2020

OTHER PUBLICATIONS

International Search Report dated Sep. 22, 2021 inPCT/CN2020/136462, 4 pages.

*Primary Examiner* — Ly D Pham
(74) *Attorney, Agent, or Firm* — Oblon, McClelland, Maier & Neustadt, L.L.P.

(57) ABSTRACT

In a method for reading a memory device including a first memory cell string, in a pre-verify stage, a first verify voltage is applied on a gate terminal of a selected memory cell of the first memory cell string, where the selected memory cell is programmed and arranged between a first adjacent memory cell and a second adjacent memory cell. A first bias voltage is applied on a gate terminal of at least one memory cell of the first memory cell string that is not programmed. In a verify stage, a second verify voltage is applied on the gate terminal of the selected memory cell of the first memory cell string. A second bias voltage is applied on the gate terminal of the at least one memory cell of the first memory cell string that is not programmed, where the second bias voltage is smaller than the first bias voltage.

20 Claims, 11 Drawing Sheets

Related U.S. Application Data continuation of application No. PCT/CN2020/136482, filed on Dec. 15, 2020.

(51) Int. Cl.
*G11C 16/10* (2006.01)
*G11C 16/26* (2006.01)
*G11C 16/30* (2006.01)

(58) Field of Classification Search
USPC .................................................. 365/185.22
See application file for complete search history.

(56) References Cited

U.S. PATENT DOCUMENTS

| | | | |
|---|---|---|---|
| 10,984,858 B2 * | 4/2021 | Date | ............ G11C 16/30 |
| 2011/0134702 A1 | 6/2011 | Imondi | |
| 2017/0025183 A1 | 1/2017 | Lee | |
| 2019/0316928 A1 | 10/2019 | Mignot et al. | |
| 2019/0318784 A1 * | 10/2019 | Lee | ............ G11C 11/5642 |
| 2019/0392909 A1 * | 12/2019 | Yang | ............ G11C 16/08 |
| 2020/0152654 A1 | 5/2020 | Hwang et al. | |
| 2020/0168279 A1 | 5/2020 | Lee | |
| 2020/0258585 A1 | 8/2020 | Lee | |
| 2021/0391026 A1 | 12/2021 | Choi | |
| 2022/0084597 A1 | 3/2022 | Mun | |
| 2022/0084610 A1 * | 3/2022 | Cantarelli | ............ G11C 11/5671 |

* cited by examiner

ARCHITECTURE AND METHOD FOR NAND MEMORY OPERATION

RELATED APPLICATION

This application is a continuation of application Ser. No. 17/191,768, filed Mar. 4, 2021, which is a bypass continuation of International Application No. PCT/CN2020/136482, filed on Dec. 15, 2020. The entire disclosures of each of the prior applications are hereby incorporated by reference in their entirety.

BACKGROUND

Flash memory devices have recently been through a rapid development. The flash memory devices are able to retain the stored data for a long period of time without applying a voltage. Further, the reading rate of the flash memory devices is relatively high, and it is easy to erase stored data and rewrite data into the flash memory devices. Thus, the flash memory devices have been widely used in microcomputers, automatic control systems, and the like. To increase the bit density and reduce the bit cost of the flash memory devices, three-dimensional (3D) NAND (Not AND) flash memory devices have been developed.

The 3D-NAND memory device can include a plurality of memory cell strings. Each of the memory cell strings can include a bottom-select-gate (BSG) transistor, memory cells, and a top-select-gate (TSG) transistor that are connected in series. In a method of verifying/reading memory cells of the 3D-NAND flash memory devices that are programmed, a pre-pulse scheme (or stage) and a verify/read scheme (or stage) can be included. In the pre-pulse scheme, a pass voltage, such as 6.8 volts, can be applied on word lines (WLs) of the memory cells in a selected memory cell string, while a gate terminal of the TSG transistor can be turned on at an unselected memory cell string. In the verify/read scheme, the pass voltage can be sustained further through the verify/read scheme at unselected WLs of the selected memory cell string, and a verify voltage can be applied on a W L of a selected memory cell in the selected memory cell string.

SUMMARY

The present disclosure describes embodiments generally related to apparatuses and methods for verifying/reading memory cells of a 3D-NAND memory device to reduce hot carrier injection (HCI)-induced edge summation (ESUM) loss, and reduce power consumption during verifying/reading the memory cells of the 3D-NAND memory device.

According to an aspect of the disclosure, a method for reading a memory device is provided. The memory device can include a first memory cell string and a second memory cell string, where the first memory cell string can include a bottom-select-gate (BSG) transistor, memory cells, and a top-select-gate (TSG) transistor that are connected in series, and the second memory cells string can include a BSG transistor, memory cells, and a TSG transistor that are connected in series. In the method, in a pre-verify stage, a first verify voltage can be applied on a gate terminal of a selected memory cell of the first memory cell string, where the selected memory cell can be programmed and arranged between a first adjacent memory cell and a second adjacent memory cell. In the pre-verify stage, a first bias voltage can be applied on a gate terminal of at least one memory cell of the first memory cell string that is positioned between the first adjacent memory cell of the selected memory cell and the TSG transistor of the first memory cell string. In a verify stage, a second verify voltage can be applied on the gate terminal of the selected memory cell of the first memory cell string. Further, in the verify stage, a second bias voltage can be applied on the gate terminal of the at least one memory cell of the first memory cell string that is positioned between the first adjacent memory cell of the selected memory cell and the TSG transistor of the first memory cell string. The second bias voltage is smaller than the first bias voltage.

In some embodiments, the second bias voltage can be from 20% to 30% smaller than the first bias voltage.

In the method, in the pre-verify stage, a first gate voltage can be applied on a gate terminal of the TSG transistor of the second memory cell string. A first pass voltage can be applied on a gate terminal of the first adjacent memory cell of the selected memory cell of the first memory cell string. A first read voltage can be applied on a gate terminal of the second adjacent memory cell of the selected memory cell of the first memory cell string. Further, in the verify stage, a second gate voltage can be applied on the gate terminal of the TSG transistor of the second memory cell string. A second pass voltage can be applied on the gate terminal of the first adjacent memory cell of the selected memory cell in the first memory cell string. A second read voltage can be applied on the gate terminal of the second adjacent memory cell of the selected memory cell in the first memory cell string. In addition, at least one of the second pass voltage and the second read voltage can be larger than the second gate voltage.

In the method, a bottom bias voltage can be applied on a gate terminal of the BSG transistor of the first memory cell string in the pre-verify stage and the verify stage. A top bias voltage can be applied on a gate terminal of the TSG transistor of the first memory cell string in the pre-verify stage and the verify stage. A positive voltage can be applied on gate terminals of any memory cells that are positioned between the second adjacent memory cell of the selected memory cell and the BSG transistor of the first memory cell string in the pre-verify stage and the verify stage.

In some embodiments, the first verify voltage can be smaller than the second verify voltage.

In some embodiments, the first bias voltage can be increased from an initial voltage, and then reduced to the second bias voltage in a first portion of the pre-verify stage, where the first bias voltage can be equal to the second bias voltage in a second portion of the pre-verify stage. The first pass voltage can be increased from the initial voltage to the second pass voltage in the pre-verify stage. The first read voltage can be increased from the initial voltage to the second read voltage in the pre-verify stage. The first gate voltage can be increased from the initial voltage to a voltage that is maintained for a duration of time, and then the first gate voltage is reduced to the second gate voltage in the first portion of the pre-verify stage, where the first gate voltage can be equal to the second gate voltage in the second portion of the pre-verify stage.

In some embodiments, the bottom bias voltage can be increased from the initial voltage to a voltage that is maintained through the second portion of the pre-verify stage and the verify stage. The top bias voltage can be increased from the initial voltage to a voltage that is maintained through the second portion of the pre-verify stage and the verify stage. The positive voltage can be increased from the initial voltage in the pre-verify stage.

According to another aspect of the disclosure, a method for reading a memory device is provided. The memory device can include a first memory cell string and a second memory cell string. The first memory cell string can include a bottom-select-gate (BSG) transistor, memory cells, and a top-select-gate (TSG) transistor that are connected in series. The second memory cells string can include a BSG transistor, memory cells, and a TSG transistor that are connected in series. In the method, in a pre-verify stage, a first verify voltage can be applied on a gate terminal of a selected memory cell of the first memory cell string, where the selected memory cell can be programmed and arranged between a first adjacent memory cell and a second adjacent memory cell. In the pre-verify stage, a first bias voltage can be applied on a gate terminal of at least one memory cell of the first memory cell string that is positioned between the second adjacent memory cell of the selected memory cell and the BSG transistor of the first memory cell string. In a verify stage, a second verify voltage can be applied on the gate terminal of the selected memory cell of the first memory cell string. In addition, in the verify stage, a second bias voltage can be applied on the gate terminal of the at least one memory cell of the first memory cell string that is positioned between the second adjacent memory cell of the selected memory cell and the BSG transistor of the first memory cell string. The second bias voltage can be smaller than the first bias voltage.

In some embodiments, the second bias voltage can be from 20% to 30% smaller than the first bias voltage.

In the method, in the pre-verify stage, a first gate voltage can be applied on a gate terminal of the TSG transistor of the second memory cell string. A first pass voltage can be applied on a gate terminal of the first adjacent memory cell of the selected memory cell in the first memory cell string. A first read voltage can be applied on a gate terminal of the second adjacent memory cell of the selected memory cell in the first memory cell string. Further, in the verify stage, a second gate voltage can be applied on the gate terminal of the TSG transistor of the second memory cell string. A second pass voltage can be applied on the gate terminal of the first adjacent memory cell of the selected memory cell in the first memory cell string. A second read voltage can be applied on the gate terminal of the second adjacent memory cell of the selected memory cell in the first memory cell string. In addition, at least one of the second pass voltage and the second read voltage can be larger than the second gate voltage.

In the method, a bottom bias voltage can be applied on a gate terminal of the BSG transistor of the first memory cell string in the pre-verify stage and the verify stage. A top bias voltage can be applied on a gate terminal of the TSG transistor of the first memory cell string in the pre-verify stage and the verify stage. A positive voltage can be applied on gate terminals of any memory cells that are positioned between the first adjacent memory cell of the selected memory cell and the TSG transistor of the first memory cell string in the pre-verify stage and the verify stage.

In some embodiments, the first verify voltage can be smaller than the second verify voltage.

In some embodiments, the first bias voltage can be increased from an initial voltage, and then reduced to the second bias voltage in a first portion of the pre-verify stage. The first bias voltage can be equal to the second bias voltage in a second portion of the pre-verify stage. The first pass voltage can be increased from the initial voltage to the second pass voltage in the pre-verify stage. The first read voltage can be increased from the initial voltage to the second read voltage in the pre-verify stage. The first gate voltage can be increased from the initial voltage to a voltage that is maintained for a duration of time, and then the first gate voltage is reduced to the second gate voltage in the first portion of the pre-verify stage. The first gate voltage can be equal to the second gate voltage in the second portion of the pre-verify stage.

In some embodiments, the bottom bias voltage can be increased from the initial voltage to a voltage that is maintained through the second portion of the pre-verify stage and the verify stage. The top bias voltage can be increased from the initial voltage to a voltage that is maintained through the second portion of the pre-verify stage and the verify stage. The positive voltage can be increased from the initial voltage in the pre-verify stage.

According to yet another aspect of the disclosure, an apparatus for reading a memory device is provided. The memory cell can include a first memory cell string and a second memory cell string. The first memory cell string can include a bottom-select-gate (BSG) transistor, memory cells, and a top-select-gate (TSG) transistor that are connected in series. The second memory cells string can include a BSG transistor, memory cells, and a TSG transistor that are connected in series. The apparatus can include processing circuitry configured to apply, in a pre-verify stage, a first verify voltage on a gate terminal of a selected memory cell of the first memory cell string, where the selected memory cell can be programmed and arranged between a first adjacent memory cell and a second adjacent memory cell. The processing circuitry can also be configured to apply, in the pre-verify stage, a first bias voltage on a gate terminal of at least one memory cell of the first memory cell string that is not programmed. In a verify stage, the processing circuitry can be configured to apply a second verify voltage on the gate terminal of the selected memory cell of the first memory cell string. Further, the processing circuitry can be configured to apply, in the verify stage, a second bias voltage on the gate terminal of the at least one memory cell of the first memory cell string that is not programmed. The second bias voltage can be smaller than the first bias voltage.

In some embodiments, the at least one memory cell of the first memory cell string that receives the first bias voltage and the second bias voltage can be positioned between the first adjacent memory cell of the selected memory cell and the TSG transistor of the first memory cell string.

In some embodiments, the at least one memory cell of the first memory cell string that receives the first bias voltage and the second bias voltage is positioned between the second adjacent memory cell of the selected memory cell and the BSG transistor of the first memory cell string.

In the pre-verify stage, the processing circuitry can further be configured to apply a first gate voltage on a gate terminal of the TSG transistor of the second memory cell string. The processing circuitry can be configured to apply a first pass voltage on a gate terminal of the first adjacent memory cell of the selected memory cell in the first memory cell string. The processing circuitry can be configured to apply a first read voltage on a gate terminal of the second adjacent memory cell of the selected memory cell in the first memory cell string. In the verify stage, the processing circuitry can be configured to apply a second gate voltage on the gate terminal of the TSG transistor of the second memory cell string. The processing circuitry can also be configured to apply a second pass voltage on the gate terminal of the first adjacent memory cell of the selected memory cell in the first memory cell string. The processing circuitry can be configured to apply a second read voltage on the gate terminal of the second adjacent memory cell of the selected memory cell in the first memory cell string, where at least one of the second pass voltage and the second read voltage can be larger than the second gate voltage.

In an embodiment, the processing circuitry can be configured to apply a bottom bias voltage on a gate terminal of the BSG transistor of the first memory cell string in the pre-verify stage and the verify stage. The processing circuitry can be configured to apply a top bias voltage on a gate terminal of the TSG transistor of the first memory cell string in the pre-verify stage and the verify stage. The processing circuitry can be configured to apply a positive voltage on gate terminals of any memory cells that are positioned between the second adjacent memory cell of the selected memory cell and the BSG transistor of the first memory cell string in the pre-verify stage and the verify stage.

In another embodiment, the processing circuitry can be configured to apply a bottom bias voltage on a gate terminal of the BSG transistor of the first memory cell string in the pre-verify stage and the verify stage. The processing circuitry can be configured to apply a top bias voltage on a gate terminal of the TSG transistor of the first memory cell string in the pre-verify stage and the verify stage. The processing circuitry can be configured to apply a positive voltage on gate terminals of any memory cells that are positioned between the first adjacent memory cell of the selected memory cell and the TSG transistor of the first memory cell string in the pre-verify stage and the verify stag Aspects of the disclosure also provide a non-transitory computer-readable medium storing instructions which when executed by a computer for verifying/reading a memory device cause the computer to perform one or more of the methods described above.

BRIEF DESCRIPTION OF THE DRAWINGS

Aspects of the present disclosure can be understood from the following detailed description when read with the accompanying figures. It is noted that, in accordance with the standard practice in the industry, various features are not drawn to scale. In fact, the dimensions of the various features may be increased or reduced for clarity of discussion.

DETAILED DESCRIPTION

Figure 1:
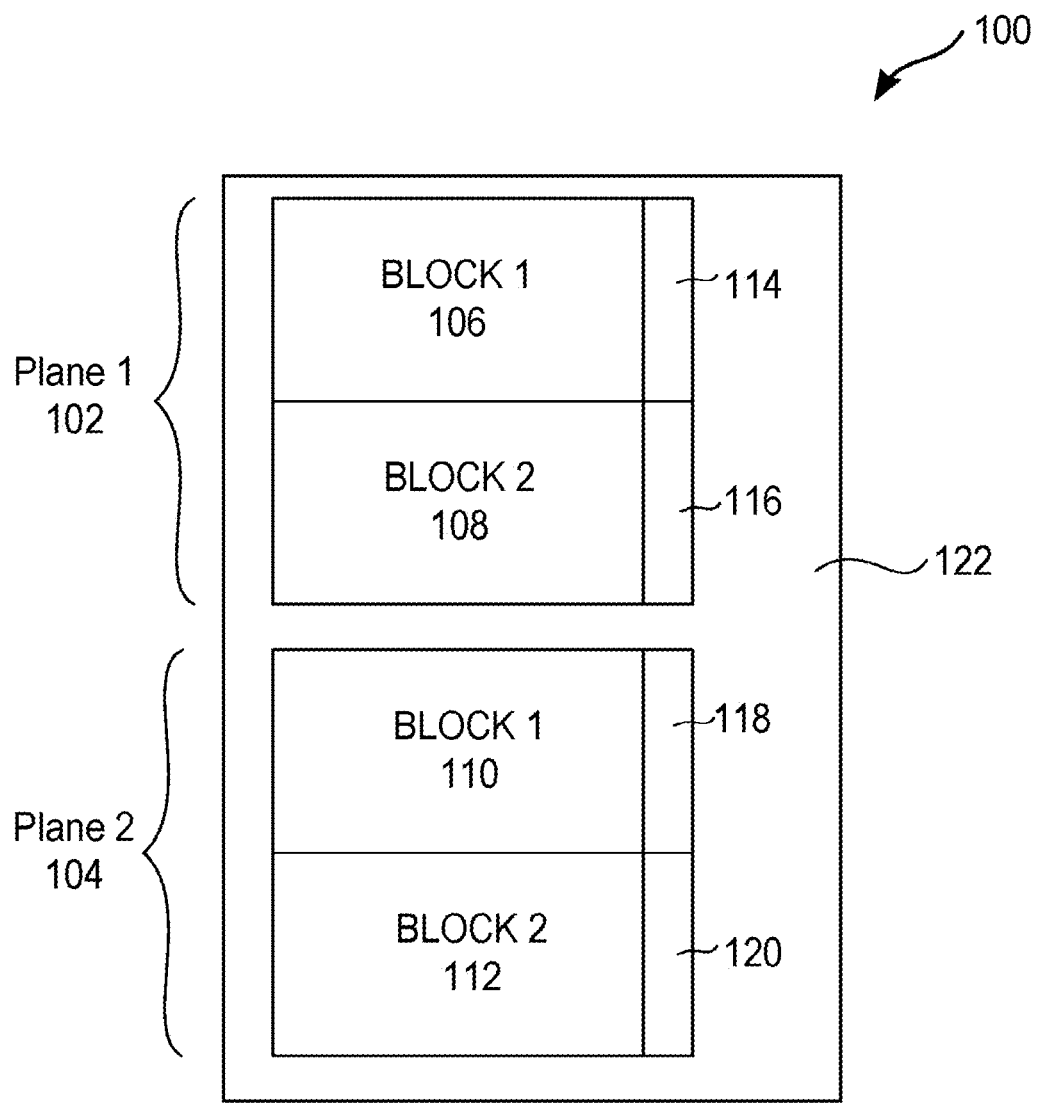
FIG. 1 is a schematic diagram of a 3D-NAND memory device, in accordance with exemplary embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features may be in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In a related example, in order to verify/read memory cells of a 3D-NAND memory device that are programmed, a pre-pulse scheme (or stage) and a verify/read scheme (or stage) can be included in a verify/read operation. In the pre-pulse scheme, a pass voltage, such as 6.8 volts, can be applied on word lines (WLs) of the memory cells in a selected memory cell string, while a gate terminal of a TSG transistor can be turned on at an unselected memory cell string. In the verify/read scheme, the pass voltage can be sustained further through the verify/read scheme at unselected WLs of the selected memory cell string, and a verify voltage can be applied on a WL of a selected memory cell in the selected memory cell string.

When a sufficient pre-pulse time is applied in the pre-pulse scheme, the pass voltage can be developed fully before the TSG transistor is switched off at the unselected memory cell string. As a result, when the TSG transistor of the unselected memory cell string is turned off in the verify/read scheme, although a drain-side channel (or terminal) of the unselected memory cell string is isolated from a bit line that is coupled to the unselected memory cell string, a considerable gradient of a channel potential may not be induced by subsequent verify/read voltages in the verify/read scheme. Accordingly, hot carrier injections (HCI) may not be generated from a selected memory cell to an upper memory cell of the selected memory cell in the selected memory cell string. Thus, an edge summation (ESUM) loss can be prevented. The ESUM loss can be associated with a read margin of the 3D-NAND memory device.

However, when an insufficient pre-pulse time is applied in the pre-pulse scheme, the pass voltage may not be developed fully before the TSG transistor is switched off at the unselected memory cell string. In the verify/read scheme, when the TSG transistor is switched off at the unselected memory cell string, the pass voltage applied on WLs of memory cells that are positioned above the selected memory cell in the selected memory cell string can still be developed to a target value, such as 6.8 volts. Thus, the drain-side channel of the unselected memory cell string can be boosted additively by the increment of the pass voltage in the verify/read scheme, which in turn can bring in the HCI between the selected memory cell and the upper adjacent memory cell of the selected memory cell, and result in the ESUM loss.

In the present disclosure, in order to verify/read programmed memory cells of a 3D-NAND memory device, a pre-pulse voltage can be applied on at least one memory cell of the selected memory cell string that is positioned above an upper adjacent memory cell of the selected memory cell string in the pre-verify scheme. A pass voltage that is smaller than the pre-pulse voltage can be applied on the at least one memory cell of the selected memory cell string that is positioned above the upper adjacent memory cell of the selected memory cell in the verify/read scheme. In addition, a pass voltage that is applied on one of the upper adjacent memory cell and a lower adjacent memory cell of the selected memory cell can be larger than a bias voltage applied on the TSG transistor of the unselected memory cell string in the verify/read scheme, where the bias voltage is applied to turn off the TSG transistor of the unselected memory cell string. Accordingly, hot-carrier injection (HCI)-induced ESUM loss can be prevented, and power consumption during verifying/reading the memory cells of the 3D-NAND memory device can be reduced.

A 3D-NAND device can include a plurality of planes. Each of the planes can include a plurality of blocks. FIG. 1 is an exemplary embodiment of a 3D-NAND device 100 (or device 100). As shown in FIG. 1, the device 100 can include planes 102 and 104. Each of the planes 102 and 104 can include two respective blocks. For example, the plane 102 can include two blocks 106 and 108, and the plane 104 can include two blocks 110 and 112. Further, each of the blocks can include a plurality of memory cell strings, where memory cells are disposed sequentially and in series over a substrate along a height direction of the device 100. Of course, it should be noted that FIG. 1 is merely an example, and the device 100 can include any number of planes, and each of the planes can include any number of blocks according to the device designs.

In the device 100, each of the planes can be coupled to a respective cache structure, such as a dynamic data cache (DDC), or a static page buffer (SPB). For example, the block 106 can be coupled to a cache structure 114 and the block 108 can be coupled to a cache structure 116. The cache structure can include sense amplifiers that are coupled to bit lines and configured to sense signals during the operation of the 3D-NAND device 100, such as verifying/reading, programming, or erasing memory cells of the 3D-NAND device 100. The device 100 can also include periphery circuits 122 that can include decoder structures, driver structures, charge structures, and other structures to operate the memory cells.

Figure 2:
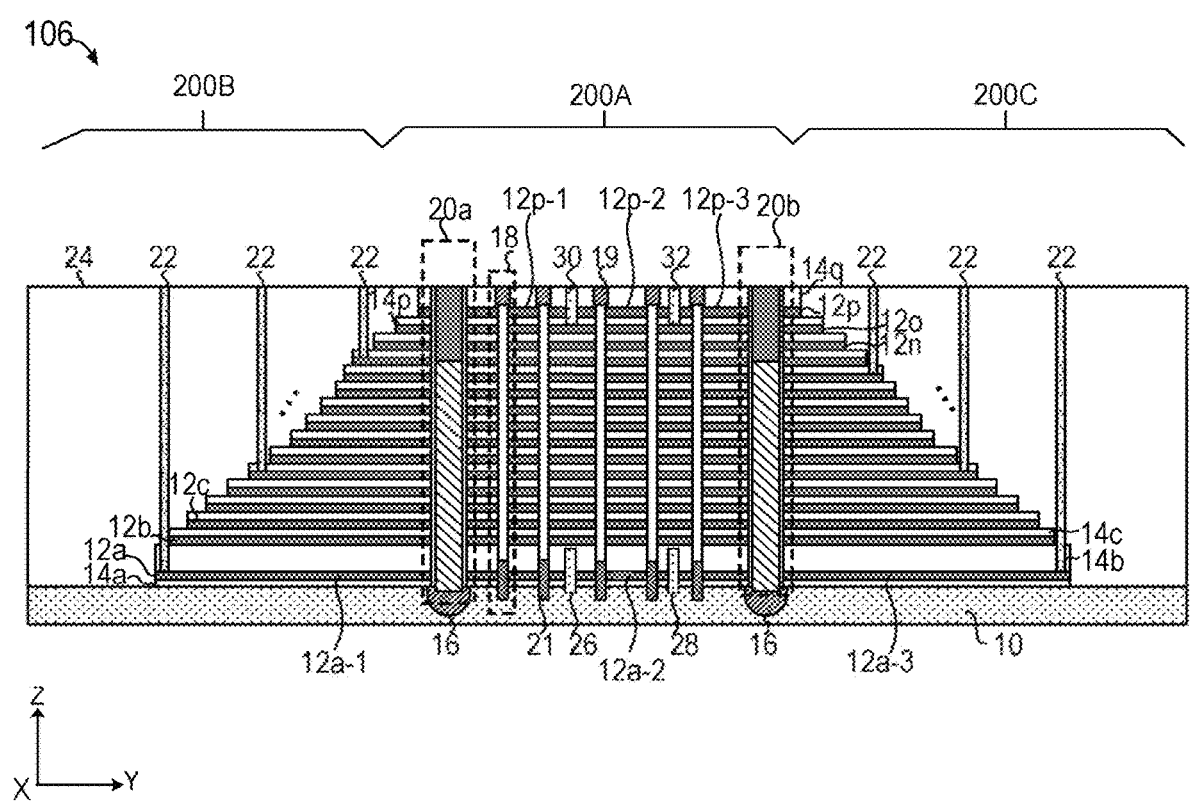
FIG. 2 is a cross-sectional view of a 3D-NAND memory device, in accordance with exemplary embodiments of the disclosure.

In the device 100, each of the blocks can include staircase regions and array regions that are formed in a stack of word line layers and insulating layers. FIG. 2 is an exemplary embodiment of the block 106 of the device 100. As shown in FIG. 2, the block 106 can include an array region 200A and staircase regions 200B-200C that are arranged in a dielectric layer 24. The array region 200A can be arranged between the staircase regions 200B-200C, and formed in a stack of alternating word line layers 12a-12p and insulating layers 14a-14q over a substrate 10. The word line layers 12a-12p can include one or more bottom select gate (BSG) layers, gate layers (or word line layers), and one or more top select gate (TSG) layers that are arranged sequentially over the substrate 10. For example, the word line layer 12a can be a BSG layer, and the word line layer 12p can be a TSG layer in the device 100.

In some embodiments, the device 100 can include one or more bottom dielectric trenches (e.g., 26 and 28) that are formed in the one or more BSGs (e.g., in the word line layer 12a). The bottom dielectric trenches 26 and 28 can extend in an X-direction of the substrate 10 to separate the BSGs into a plurality of sub-BSGs (e.g., 12a-1, 12a-2, and 12a-3). In addition, one or more top dielectric trenches (e.g., 30 and 32) can be formed in the one or more TSGs (e.g., in the word line layer 12p). The top dielectric trenches 30 and 32 can also extend in the X-direction of the substrate 10 to separate the TSGs into a plurality of sub-TSGs (e.g., 12p-1, 12p-2, and 12p-3). The sub-BSGs and sub-TSGs can divide the device 100 into a plurality of sub-blocks. Each of the sub-blocks can have a respective sub-BSG and a respective sub-TSG. Thus, memory cells strings in a corresponding sub-block can be operated individually through controlling the respective sub-BSG and respective sub-TSG.

The array region 200A can include a plurality of channel structures 18. Each of the channel structures 18 can include a respective top channel contact 19 and a respective bottom channel contact 21. Each of the channel structure 18 can extend through the stack and be coupled to the word line layers 12a-12p to form a respective vertical NAND memory cell string. The vertical NAND memory cell string can include one or more bottom select transistors (BSTs), a plurality of memory cells (MCs), and one or more top select transistors (TSTs) that are disposed sequentially and in series over the substrate along a height direction (e.g., Z direction) of the substrate 10. The one or more BSTs can be formed of the channel structure and the one or more BSG layers, the MCs can be formed of the channel structure and the word line layers, and the one or more TSTs can be formed of the channel structure and the one or more TSG layers.

In the device 100, each of the memory cells can store one or more logic bits, according to the device designs. For example, the memory cells can be single level cells (SLCs), multiple level cells (MLCs), or triple level cells (TLCs). Accordingly, each of the memory cells can store one logic bit, two logic bits, or three logic bits.

Still referring to FIG. 2, the word line layers 12a-12p can be formed in a stair-cased configuration in the staircase regions 200A-200B, and a plurality of word line contacts 22 can be formed along the height direction and coupled to the word line layers 12a-12p. Thus, gate voltages can be applied on gates of the memory cells through the word line contacts 22 that are coupled to the word line layers 12a-12p.

In addition, each of the channel structures can further be coupled to a respective bit line (or bit line structure). In some embodiments, the bit line can be connected to the top channel contact 19 of the channel structure 18, and configured to apply a bias voltage when operating the channel structure, such as programming, erasing, or reading the channel structure. The device 100 can have a plurality of slit structures (or gate line slit structures). For example, two slit structures 20a-20b are included in FIG. 2. The slit structures 20a-20b can be made of conductive materials and positioned on array common source (ACS) regions 16 to serve as contacts. The ACS regions are formed in the substrate 10 to serve as common sources of the device 100.

Figure 3:
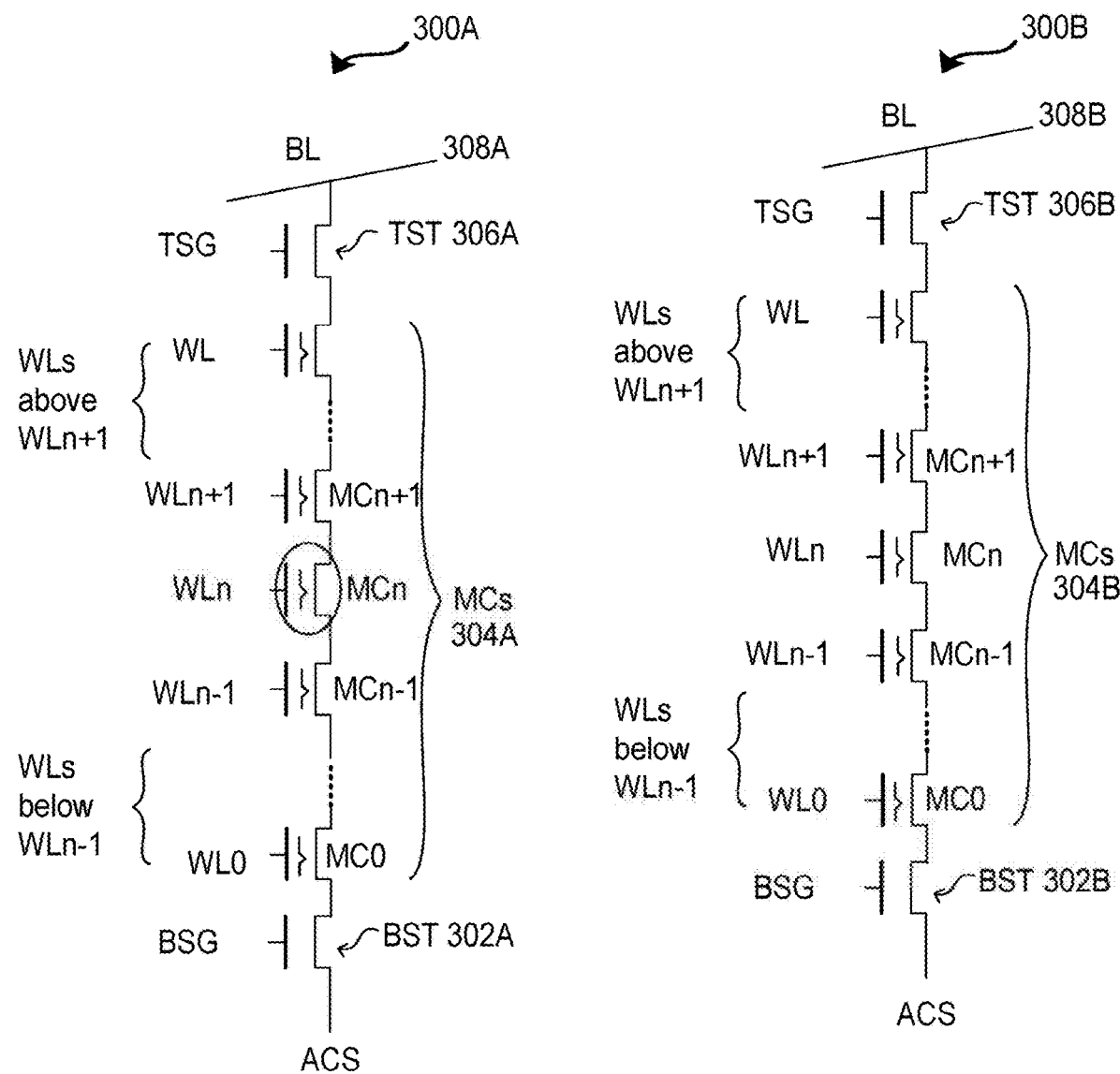
FIG. 3 is a schematic diagram of NAND memory cell strings, in accordance with exemplary embodiments of the disclosure.

FIG. 3 is a schematic view of NAND memory cell strings (or strings) 300A and 300B that can be formed in the device 100. As shown in FIG. 3, the string 300A can include a bottom select transistor (BST) or bottom-select-gate (BSG) transistor 302A, a plurality of memory cells (MCs) 304A, and a top select transistor (TST) or top-select-gate (TSG) transistor 306A that are disposed sequentially and in series over the substrate along the height direction (e.g., Z direction) of the substrate 10. Similarly, the string 300B can include a bottom select transistor (BST) or bottom-select-gate (BSG) transistor 302B, a plurality of memory cells (MCs) 304B, and a top select transistor (TST) or top-select-gate (TSG) transistor 306B that are disposed sequentially and in series over the substrate along the height direction (e.g., Z direction) of the substrate 10. The string 300A can be coupled to a bit line 308A through a drain terminal of the TST 306A, and coupled to an ACS (e.g., 16) through a source terminal of the BST 302A. The string 300B can be coupled to a bit line 308B through a drain terminal of the TST 306B, and coupled to the ACS (e.g., 16) through a source terminal of the BST 302B. During the operation of the device 100, appropriate voltages can be applied to the bit lines 308A and 308B, the gates of the TST 306A and 306B through the sub-TSG layers (e.g., 12p-1, 12p-2, and 12p-3), the gates of the MCs 304A and 304B through the WL layers (e.g., 12b-12o), the gates of the BST 302A and 302B through the sub-BSG layers (e.g., 12a-1, 12a-2, and 12a-3), and the ACS through the slit structures (e.g., 20a or 20b).

When a selected memory cell of the 3D-NAND memory device is programmed, a verify/read operation can be applied to verify if a selected memory cell (e.g., MCn) has been programmed successfully. In the verify/read operation, bias voltages (or pass voltages) can be applied on gate terminals (or gates) of the TSG transistor through the TSG layer, the BSG transistor through the BSG layer, and the unselected MCs through the WL layers respectively. The bias voltages can be sufficient, such as 6.8 volts, to turn on the TSG transistor, the BSG transistor, and the unselected MCs. In addition, a read (or verify) voltage can be applied on the gate terminal (or gate) of the selected memory cell MCn through a WL layer (e.g., WLn) that is coupled to the selected memory cell MCn. The read voltage can be equal to a threshold voltage of the selected memory cell when the selected memory cell is not programmed. When the selected memory cell is programmed, the threshold voltage can be increased. Thus, when the selected memory cell is programmed successfully, the read voltage cannot turn on the selected memory cell. Accordingly, the sense amplifier cannot detect current to flow through the memory cell string from ACS region (e.g., 16) to the bit line. When the selected memory cell is not programmed successfully, the read voltage can turn on the selected memory cell, and the sense amplifier can detect current to flow through the memory cell string from ACS region (e.g., 16) to the bit line.

Figure 4:
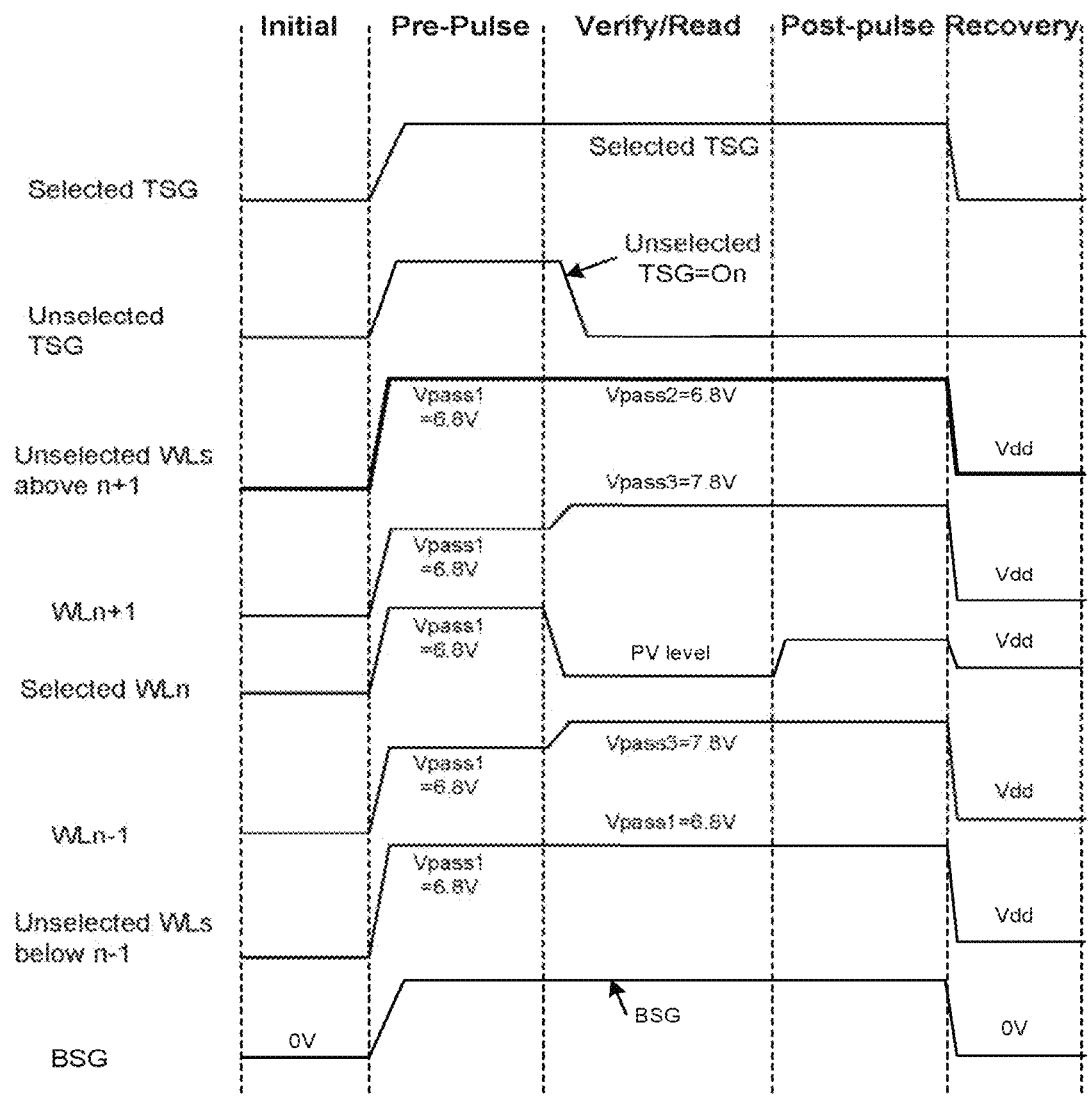
FIG. 4 is a first schematic diagram of verifying/reading memory cells in a related example, in accordance with exemplary embodiments of the disclosure.

FIG. 4 is a first schematic diagram of a verify/read operation to verify/read memory cells of a 3D-NAND memory device (e.g., device 100) in a related example. As shown in FIG. 4, the verify/read operation can include an initial stage, a pre-pulse stage, a verify/read stage, a post-pulse stage, and a recovery stage. The verify/read operation can be configured to verify whether memory cells are programmed successfully by applying appropriate bias voltages on the word line layers of the memory cells, the TSG layer of the TSG transistor, and the BSG layer of the BSG transistor. In an exemplary embodiment of FIG. 4, the memory cells of the device 100 can be programmed in a forward order. Thus, memory cells in a memory cell string are programmed from a bottom MC adjacent to the BSG transistor to a top MC adjacent to the TSG transistor. For example, in the memory cell string 300A, the memory cells are programmed sequentially from MC0 to the top MC that is adjacent to the TSG transistor 306A.

FIG. 4 illustrates the bias voltages applied on two exemplary memory cell strings that include a selected memory cell string (e.g., 300A) and an unselected memory cell string (e.g., 300B). The selected memory cell string can have a selected TSG layer coupled to the TSG transistor (e.g., 306A), a selected word line layer WLn coupled to a selected memory cell (e.g., MCn), a word line layer WLn+1 coupled to a memory cell MCn+1 that is an upper adjacent memory cell of selected memory cell MCn, a word line layer WLn−1 coupled to a memory cell MCn−1 that is a lower adjacent memory cell of the selected memory cell MCn, word line layers WLs (>n+1) coupled to the memory cells that are unselected and positioned above the memory cell MCn+1, word line layers WLs (<n−1) coupled to the memory cells that are unselected and positioned below the memory cell MCn−1, and a BSG layer coupled to the BSG transistor (e.g., 302A). The TSG transistor (or TST) 306A, the memory cells, and the BSG transistor (BST) 302A are connected in series, which can be shown in FIG. 3.

Still referring to FIG. 4, the unselected memory cell string (e.g., 300B) can have a unselected TSG layer coupled to the TSG transistor (e.g., 306B), a selected word line layers WLn coupled to a selected memory cell (e.g., MCn), a word line layer WLn+1 coupled to a memory cell MCn+1 that is an upper adjacent memory cell of the selected memory cell MCn, a word line layer WLn−1 coupled to a memory cell MCn−1 that is a lower adjacent memory cell of the selected memory cell MCn, word line layers WLs (>n+1) coupled to the memory cells that are unselected and positioned above the memory cell MCn+1, word line layers WLs (<n−1) coupled to the memory cells that are unselected and positioned below the memory cell MCn−1, and a BSG layer coupled to the BSG transistor (e.g., 302B). As shown in FIG. 3, the TSG transistor (or TST) 306B, the memory cells, and the BSG transistor (or BST) 302B are connected in series.

In some embodiments the selected TSG layer and the unselected TSG layer can be one of the sub-TSG layers 12p-1, 12p-2, and 12p-3 that are separated from one another by the top dielectric trenches 30 and 32, for example. In some embodiments, the word line layers in the selected memory cell string and the word line layers in the unselected memory cell string can be the word line layers 12b-12o that are illustrated in FIG. 2. Thus, a memory cell of the selected memory cell string is coupled to a memory cell in a corresponding position of the unselected memory cell. For example, the selected memory cell MCn of the selected memory cell string 300A is coupled to the selected memory cell MCn of the unselected memory cell string 300B through a same word line layer.

When the verify/read operation is started, in the initial stage of the verify/read operation shown in FIG. 4, an initial voltage, such as zero volt, can be applied on the selected TSG layer, the unselected TSG layer, the WLs (>n+1), the WLn+1, the WLn, the WLs (<n−1), and the BSG layer. Further, appropriate bias voltages can be applied on the selected TSG layer, the unselected TSG layer, the WLs (>n+1), the WLn+1, the WLn, the WLs (<n−1), and the BSG layer in the pre-pulse stage respectively. For example, a bias voltage (or top bias voltage), such as 5 volts, can be applied on the selected TSG layer of the selected memory cell string. A bias voltage (or gate voltage), such as 5 volts, can be applied on the unselected TSG layer of the unselected memory cell string. A bias voltage, such as 6.8 volts, can be applied on the WLs (>n+1). A bias voltage (or pass voltage), such as 6.8 volts, can be applied on the WLn+1. A bias voltage (or verify voltage), such as 6.8 volts, can be applied on the selected word line layer WLn. A bias voltage (or read voltage), such as 6.8 volts, can be applied on WLn−1. A bias voltage (or positive voltage), such as 6.8 volts, can be applied on the WLs (<n−1). In addition, a bias voltage (or bottom bias voltage), such as 5 volts, can be applied on the BSG layer. The pre-pulse stage can be configured to apply sufficient bias voltages to form conducting channels in the selected memory cell string and the unselected memory cell string respectively.

When the verify/read operation proceed to the verify/read stage, the bias voltage (or top bias voltage) applied on the selected TSG layer of the selected memory cell string remains. The bias voltage (or gate voltage) applied on the unselected TSG layer of the unselected memory cell string can be reduced to a lower voltage, such as zero volt to turn off the TSG transistor (e.g., 306B) of the unselected memory cell string. Accordingly, the unselected memory cell string is isolated from the bit line (e.g., 308B). The bias voltage applied on the WLs (>n+1) can be maintained to keep the channel of the selected memory cell string conductive. The bias voltage (or pass voltage) applied on the WLn+1 can be increased, such as by one volt, from the bias voltage applied on the pre-pulse stage. In addition, the bias voltage (or read voltage) applied on WLn−1 can be increased, such as by one volt, from the bias voltage applied on the pre-pulse stage. A higher bias voltage applied on the WLn+1 and the WLn−1 can help form source/drain regions for the selected memory cell MCn.

Still referring to FIG. 4, the bias voltage (or verify voltage) applied on the selected word line layer WLn can be reduced to a programming verify (PV) level. In some embodiments, the PV level can be in a range from zero volt to one volt. The bias voltage (or positive voltage) applied on the WLs (<n−1) can be maintained to keep the channel of the selected memory cell string conductive. In addition, the bias voltage (or bottom bias voltage) applied on the BSG layer can be maintained to keep the channel of the selected memory cell string conductive. As mentioned above, the bias voltage (or verify voltage) applied on the selected word line layer WLn can be equal to the threshold voltage of the selected memory cell when the selected memory cell is not programmed. When the selected memory cell is programmed, the threshold voltage can be increased. Thus, when the selected memory cell is programmed successfully, the read voltage cannot turn on the selected memory cell. Accordingly, the sense amplifier cannot detect current to flow through the memory cell string from ACS to the bit line. When the selected memory cell is not programmed successfully, the read voltage can turn on the selected memory cell, and the sense amplifier can detect current to flow through the memory cell string from ACS to the bit line.

It should be noted that in FIG. 4, a long pre-pulse time, such as in a range from 1 ns to 10 us, is applied in the pre-pulse stage. When the long pre-pulse time is sufficient for the bias voltages to be developed fully before the TSG transistor is switched off at the unselected memory cell string, a considerable gradient of a channel potential may not be induced by subsequent verify/read pulses in the verify/read stage. Thus, hot carrier injection (HCI) may not be generated from the selected memory cell to the upper adjacent memory cell of the selected memory cell in the selected memory cell. However, when the long pre-pulse time is insufficient for the bias voltages in the pre-pulse stage to be developed fully before the TSG transistor is switched off at the unselected memory cell string, a considerable gradient of the channel potential can be induced by subsequent verify/read pulses in the verify/read stage, and HCI can be generated from the selected memory cell to the upper adjacent memory cell of the selected memory cell in the selected memory cell.

Figure 5:
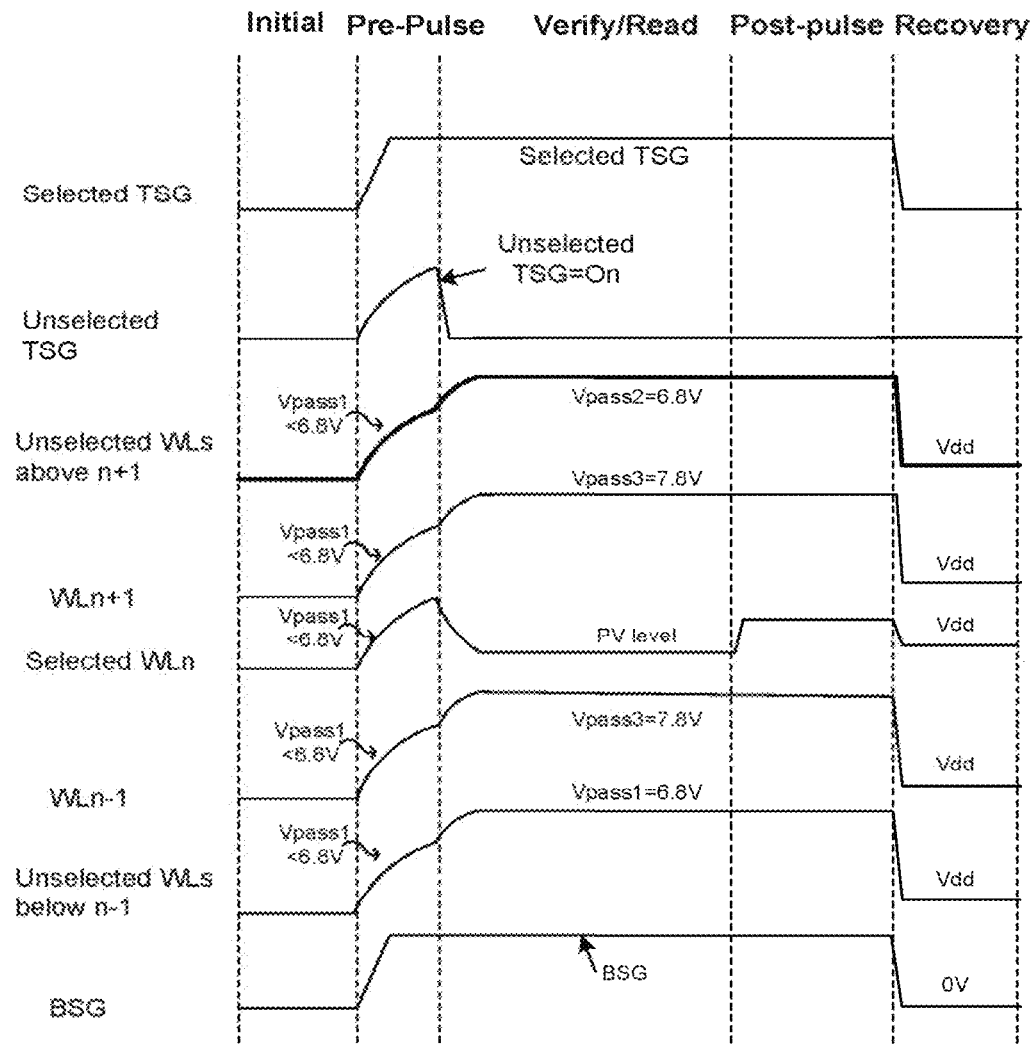
FIG. 5 is a second schematic diagram of verifying/reading memory cells in a related example, in accordance with exemplary embodiments of the disclosure.

FIG. 5 is a second schematic diagram of a verify/read operation to verify/read memory cells of a 3D-NAND memory device (e.g., device 100) that are also programmed in the forward order in a related example. The verify/reading operation can have a pre-pulse stage with a short pre-pulse time. The short pre-pulse time may be insufficient for the bias voltages applied on the WLs (>n+1), WLn+1, WLn, WLn−1, and WLs (<n−1) to be developed fully in the pre-pulse stage. For example, as shown in FIG. 5, the bias voltages are less than a target value, such as 6.8 volts. The bias voltages can still be developed to the target value, such as 6.8 volts, in the verify/read stage. Thus, the drain-side channel of the unselected memory cell string can be boosted additively by incrementing the bias voltages in the verify/read stage, which can bring in the HCI between the selected memory cell (WLn) and the upper adjacent memory cell (WLn+1) of the selected memory cell, and result in the ESUM loss.

Figure 6:
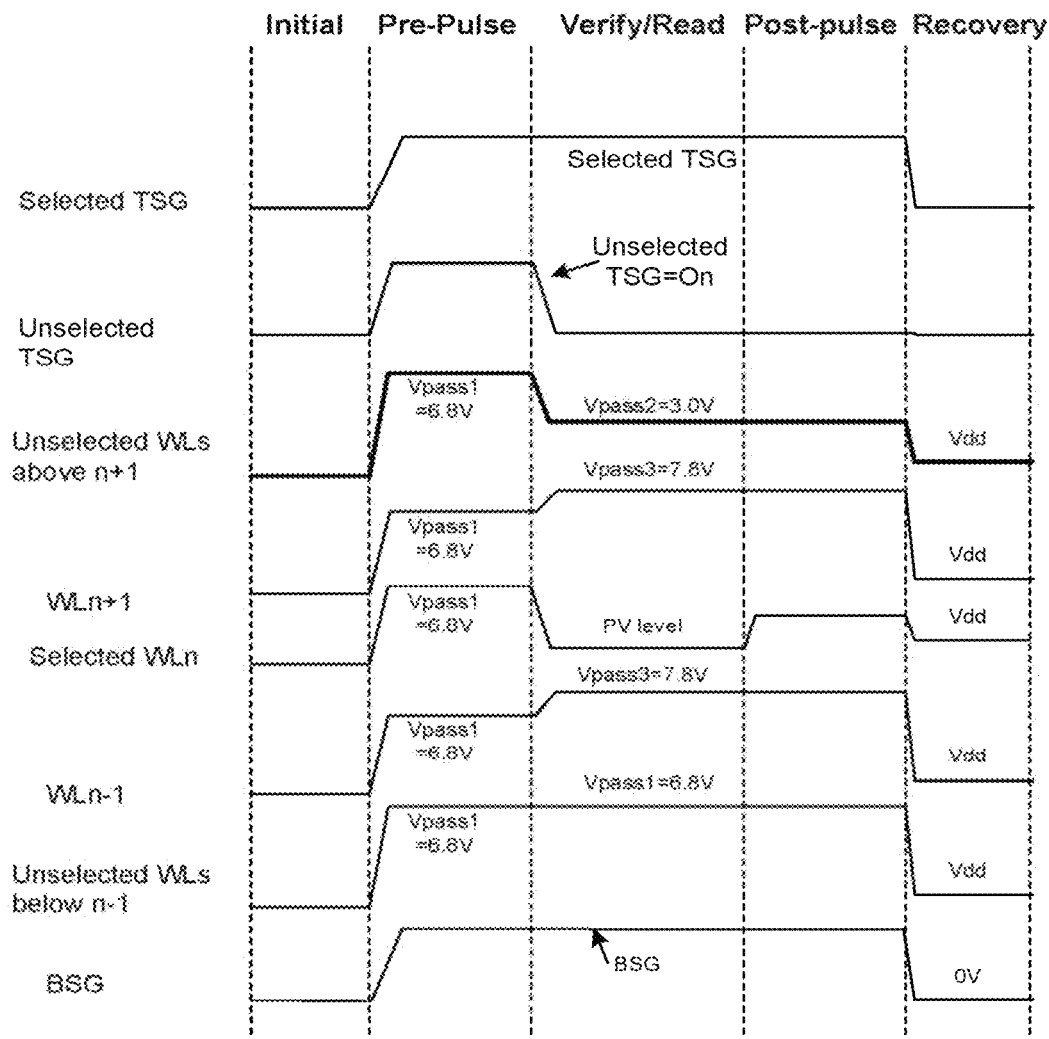
FIG. 6 is a first schematic diagram of verifying/reading memory cells that are programmed in a forward order, in accordance with exemplary embodiments of the disclosure.

FIG. 6 is a first schematic diagram of a verify/read operation to verify/read memory cells of a 3D-NAND memory device (e.g., device 100) in accordance with exemplary embodiments of the disclosure. As shown in FIG. 6, the memory cells can be programmed in the forward order, and the verify/read operation can include a long pre-pulse time in the pre-pulse stage. In an exemplary embodiment of FIG. 6, the memory cells MC0-MCn are programmed, and the memory cells above MCn are not programmed. In addition, the memory cell MCn that is coupled to the WLn is selected to receive the verify/read operation.

Compared to the verify/read operation in FIG. 4, the bias voltage applied on the WLs (>n+1) in the verify/read stage is lower than the bias voltage applied on the WLs (>n+1) in the pre-pulse stage. In an exemplary embodiment of FIG. 6, the bias voltage applied on the WLs (>n+1) in the verify/read stage can be 3 volts, and the bias voltage applied on the WLs (>n+1) in the pre-pulse stage can be 6.8 volts. In some embodiments, the bias voltage applied on the WLs (>n+1) in the verify/read stage is a percentage (e.g., from 20% to 30%) lower than the bias voltage applied on the WLs (>n+1) in the pre-pulse stage. In some embodiments, each of the memory cells that are positioned above the upper adjacent memory cell of the selected memory cell MCn can receive a bias voltage through the WLs (>n+1) in the verify/read stage that is lower than a bias voltage in the pre-pulse stage. In some embodiments, at least one memory cell of the memory cells that are positioned between the upper adjacent memory cell of the selected memory cell MCn and the TSG transistor can receive a bias voltage through the WLs (>n+1) in the verify/read stage that is lower than a bias voltage in the pre-pulse stage. For example, a memory cell that is adjacent to the TSG transistor can receive a bias voltage in the verify/read stage that is lower than a bias voltage in the pre-pulse stage.

By introducing a lower bias voltage in the verify/read stage in the memory cells that are positioned above the upper adjacent memory cell MCn+1 of the selected memory cell MCn, the gradient of the channel potential of the selected memory cell string can be reduced. Accordingly, HCI cannot be generated from the selected memory cell to the upper adjacent memory cell of the selected memory cell in the selected memory cell string. Thus, the ESUM loss can be prevented.

Figure 7:
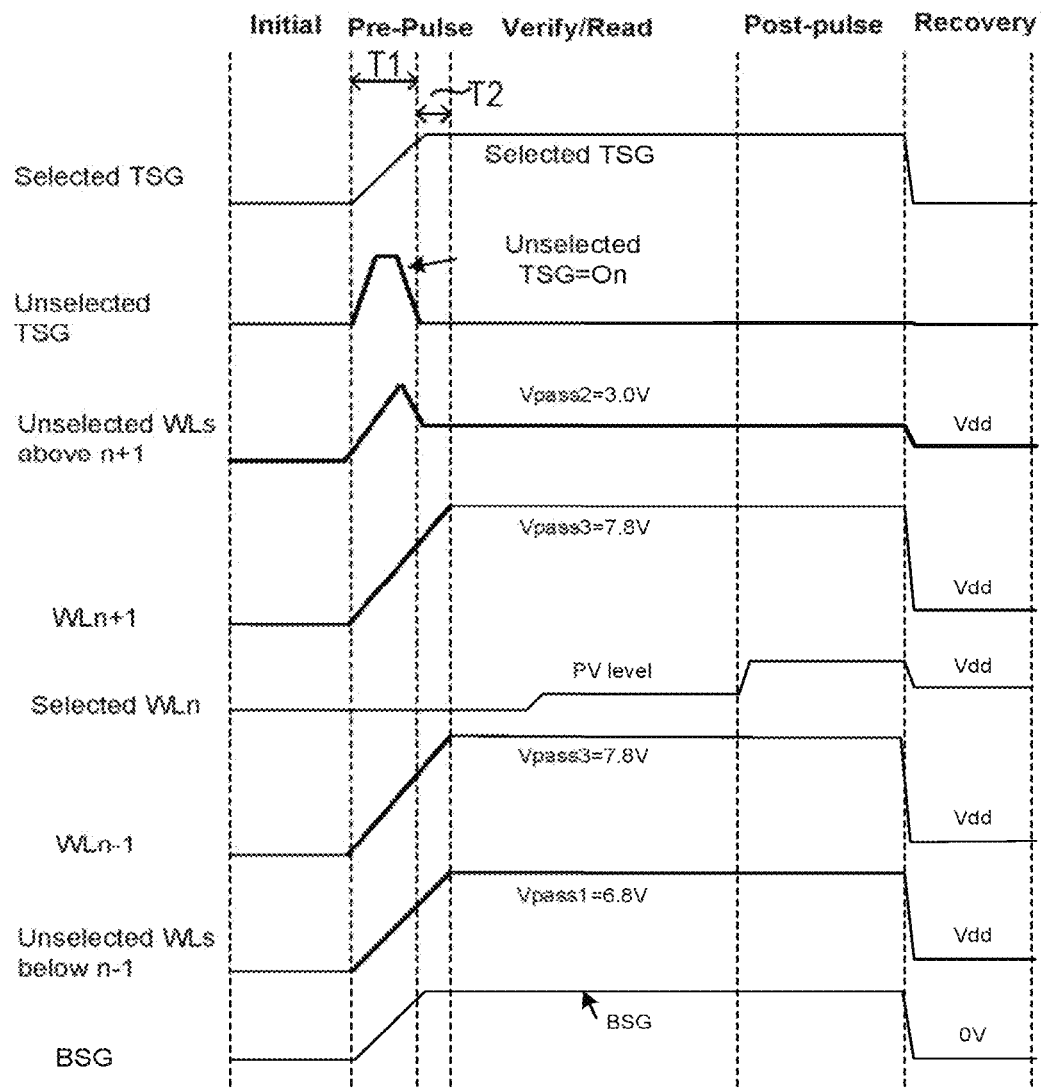
FIG. 7 is a second schematic diagram of verifying/reading memory cells that are programmed in a forward order, in accordance with exemplary embodiments of the disclosure.

FIG. 7 is a second schematic diagram of a verify/read operation to verify/read memory cells of a 3D-NAND memory device (e.g., device 100) in accordance with exemplary embodiments of the disclosure. As shown in FIG. 7, the memory cells can be programmed in the forward order, and the verify/read operation can include a short pre-pulse time in the pre-pulse stage. As shown in FIG. 7, the pre-pulse stage can include a first portion T1 and a second portion T2. Compared to the verify/read operation in FIG. 5, the bias voltages applied in the pre-pulse stage can be full developed to (or completely reach) target values in FIG. 7. For example, the bias voltage applied on the WLs (>n+1) can be fully developed in the pre-pulse stage. As shown in FIG. 7, the bias voltage applied on the WLs (>n+1) can be increased to a target value from the initial voltage in the first portion of the pre-pulse stage. The target value can be 6.8 volts, for example. The bias voltage can then be reduced in the first portion of the pre-verify stage to a lower value (e.g., 3 volts) that is equal to the bias voltage of the verify/read stage. The bias voltage is further maintained in the second portion of the pre-verify stage.

Still referring to FIG. 7, the pass voltage applied on the WLn+1 can be increased from the initial voltage to a target value (e.g., 7.8 volts) in the pre-verify stage, where the target value is equal to the pass voltage of the verify/read stage. The read voltage applied on the WLn−1 can be increased from the initial voltage to a target value (e.g., 7.8 volts) in the pre-verify stage, where the target value is equal to the read voltage of the verify/read stage. The gate voltage applied on the unselected TSG can be increased from the initial voltage to a target value (e.g., 5 volts) in the first portion of the pre-pulse stage. The gate voltage can then be maintained for a duration of time, and then be reduced to a value that is equal to the gate voltage of the verify/read stage in the first portion of the pre-verify stage. The gate voltage can be maintained to be equal to the gate voltage of the verify/read stage in the second portion of the pre-verify stage.

The bottom bias voltage applied on BSG transistor can be increased from the initial voltage to a target value (e.g., 5 volts) in the first portion of the pre-pulse stage, where the target value is equal to the bottom bias voltage of the verify/read stage. The bottom bias voltage can be maintained through the second portion of the pre-verify stage and the verify stage. Similarly, the top bias voltage applied on the selected TSG transistor can be increased from the initial voltage to a target value (e.g., 5 volts) in the first portion of the pre-pulse stage. The top bias voltage can further be maintained through the second portion of the pre-verify stage and the verify stage. The positive voltage applied on the WLs (<n−1) can be increased from the initial voltage in the pre-verify stage to a target value (e.g., 6.8 volts) in the pre-pulse stage, where the target value is equal to the positive voltage applied in the verify/read stage.

In the verify/read operation in FIG. 7, the bias voltage applied on the WLs (>n+1) in the verify/read stage can be lower than the bias voltage applied on the WLs (>n+1) in the pre-pulse stage. In an exemplary embodiment of FIG. 7, the bias voltage applied on the WLs (>n+1) in the verify/read stage can be 3 volts, and the bias voltage applied on the WLs (>n+1) in pre-pulse stage can be 6.8 volts. In some embodiments, each of the memory cells that are positioned above the upper adjacent memory cell MCn+1 of the selected memory cell MCn can receive a bias voltage through the WLs (>n+1) in the verify/read stage that is lower than a bias voltage in the pre-pulse stage. In some embodiments, at least one memory cell of the memory cells that are positioned between the upper adjacent memory cell MCn+1 of the selected memory cell MCn and the TSG transistor can receive a bias voltage through the WLs (>n+1) in the verify/read stage that is lower than a bias voltage in the pre-pulse stage. For example, a memory cell that is adjacent to the TSG transistor can receive a bias voltage in the verify/read stage that is lower than a bias voltage in the pre-pulse stage.

Further, in the verify/read operation in FIG. 7, at least one of the upper adjacent memory cells MCn+1 and the lower adjacent memory cell MCn−1 of the selected memory cell MCn can receive a bias voltage that is higher than the bias voltage applied on the unselected TSG transistor in the verify/read stage.

Compared to the verify/read operation in FIG. 5, the bias voltages applied in the pre-pulse stage of the verify/read operation in FIG. 7 are fully developed to target values. In addition, a lower bias voltage is introduced in the verify/read stage for the memory cells positioned above the upper adjacent memory cell of the selected memory cell MCn. Accordingly, the gradient of the channel potential of the selected memory cell string can be reduced, and formation of the HC can be prevented from the selected memory cell to the upper adjacent memory cell of the selected memory cell in the selected memory cell string. Thus, the ESUM loss can be prevented.

Figure 8:
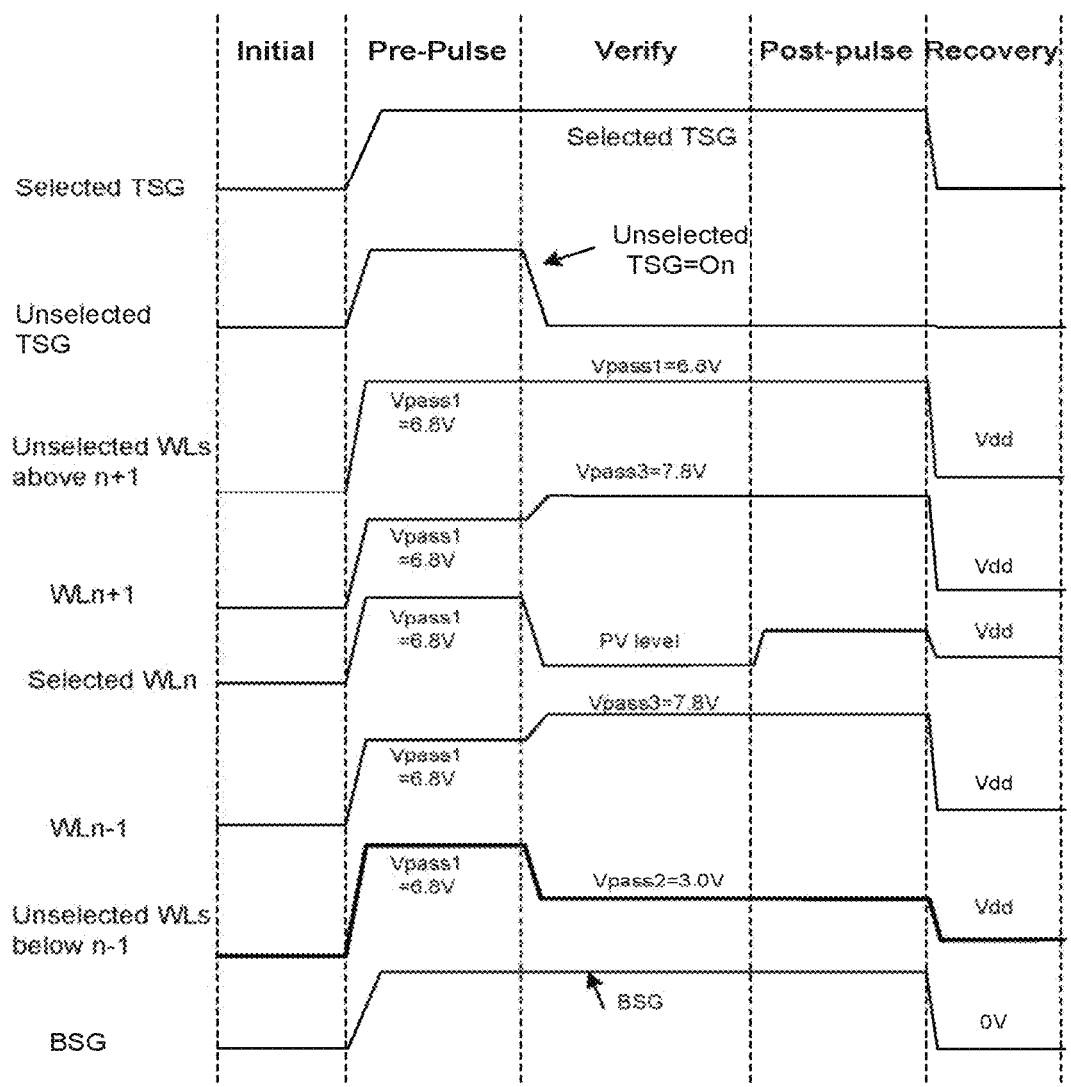
FIG. 8 is a first schematic diagram of verifying/reading memory cells that are programmed in a reverse order, in accordance with exemplary embodiments of the disclosure.

FIG. 8 is a first schematic diagram of a verify/read operation to verify/read memory cells that are programmed in a reverse order in accordance with exemplary embodiments of the disclosure. As shown in FIG. 8, the memory cells can be programmed in the reverse order in that the memory cells are programmed from a top memory cell adjacent to the TSG transistor to a bottom memory cell (e.g., MC0) adjacent to the BSG transistor. In an exemplary embodiment of FIG. 8, the selected memory cell MCn and the memory cells above the selected memory cell MCn are programmed. In addition, the pre-pulse stage of the verify/read operation in FIG. 8 can have a long pre-pulse time.

As shown in FIG. 8, compared to the verify/read operation shown in FIG. 6 to verify/read the memory cells that are programmed in the forward order, the bias voltage applied on the WLs (<n−1) in the verify/read stage is lower than the bias voltage applied on the WLs (<n−1) in the pre-pulse stage. In some embodiments, each of the memory cells that are positioned between the lower adjacent memory cell MCn−1 of the selected memory cell MCn and the BSG transistor can receive a bias voltage through the WLs (<n−1) in the verify/read stage that is lower than a bias voltage in the pre-pulse stage. In some embodiments, at least one memory cell of the memory cells that are positioned between the lower adjacent memory cell MCn−1 of the selected memory cell MCn and the BSG transistor can receive a bias voltage through the WLs (<n−1) in the verify/read stage that is lower than a bias voltage in the pre-pulse stage. For example, a memory cell that is adjacent to the BSG transistor can receive a bias voltage in the verify/read stage that is lower than a bias voltage in the pre-pulse stage.

Figure 9:
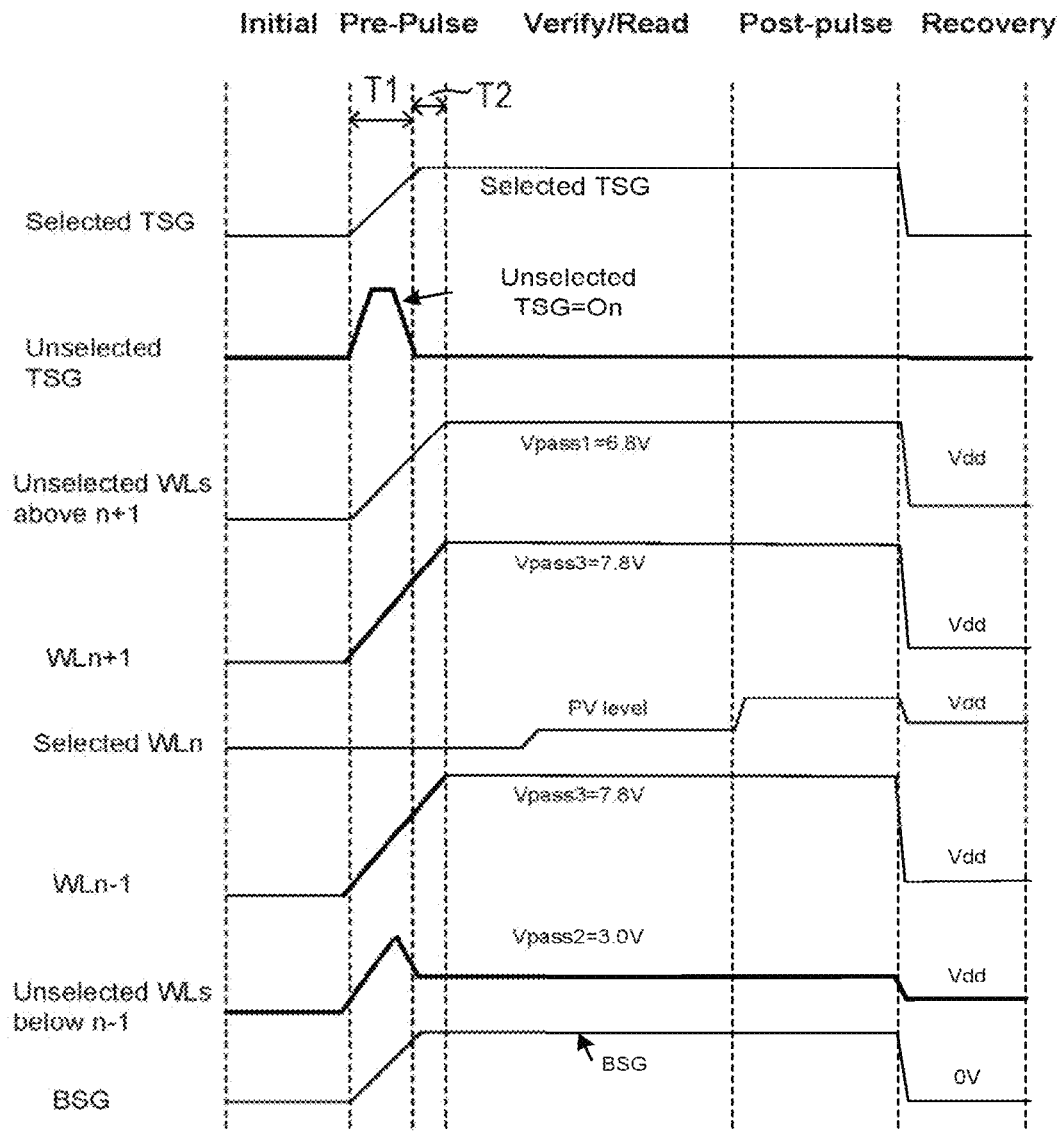
FIG. 9 is a second schematic diagram of verifying/reading memory cells that are programmed in a reverse order, in accordance with exemplary embodiments of the disclosure.

FIG. 9 is a second schematic diagram of a verify/read operation to verify/read memory cells that are programmed in a reverse order in accordance with exemplary embodiments of the disclosure. Compared to the verify/read operation shown in FIG. 7 to verify/read the memory cells that are programmed in the forward order, the bias voltage applied on the WLs (<n−1) in the verify/read stage is lower than the bias voltage applied on the WLs (<n−1) in the pre-pulse stage. In some embodiments, each of the memory cells that are positioned below the lower adjacent memory cell MCn−1 of the selected memory cell MCn can receive a bias voltage through the WLs (<n−1) in the verify/read stage that is lower than a bias voltage in the pre-pulse stage. In some embodiments, at least one memory cell of the memory cells that are positioned between the lower adjacent memory cell MCn−1 of the selected memory cell MCn and the BSG transistor can receive a bias voltage through the WLs (<n−1) in the verify/read stage that is lower than a bias voltage in the pre-pulse stage. For example, a memory cell that is adjacent to the BSG transistor can receive a bias voltage in the verify/read stage that is lower than a bias voltage in the pre-pulse stage.

Similar to the verify/read operations shown in FIGS. 6 and 7, the verify/read operations shown in FIGS. 8 and 9 include a bias voltage that can fully be developed in the pre-pulse stage. In addition, the bias voltage applied on at least one of the memory cells that are not programmed in the pre-pulse stage can be lower than the bias voltage applied in the verify/read stage. Accordingly, the gradient of the channel potential of the selected memory cell string can be reduced, and formation of the HC can be prevented from the selected memory cell MCn to the lower adjacent memory cell MCn−1 of the selected memory cell in the selected memory cell string. Thus, the ESUM loss can be prevented.

Figure 10:
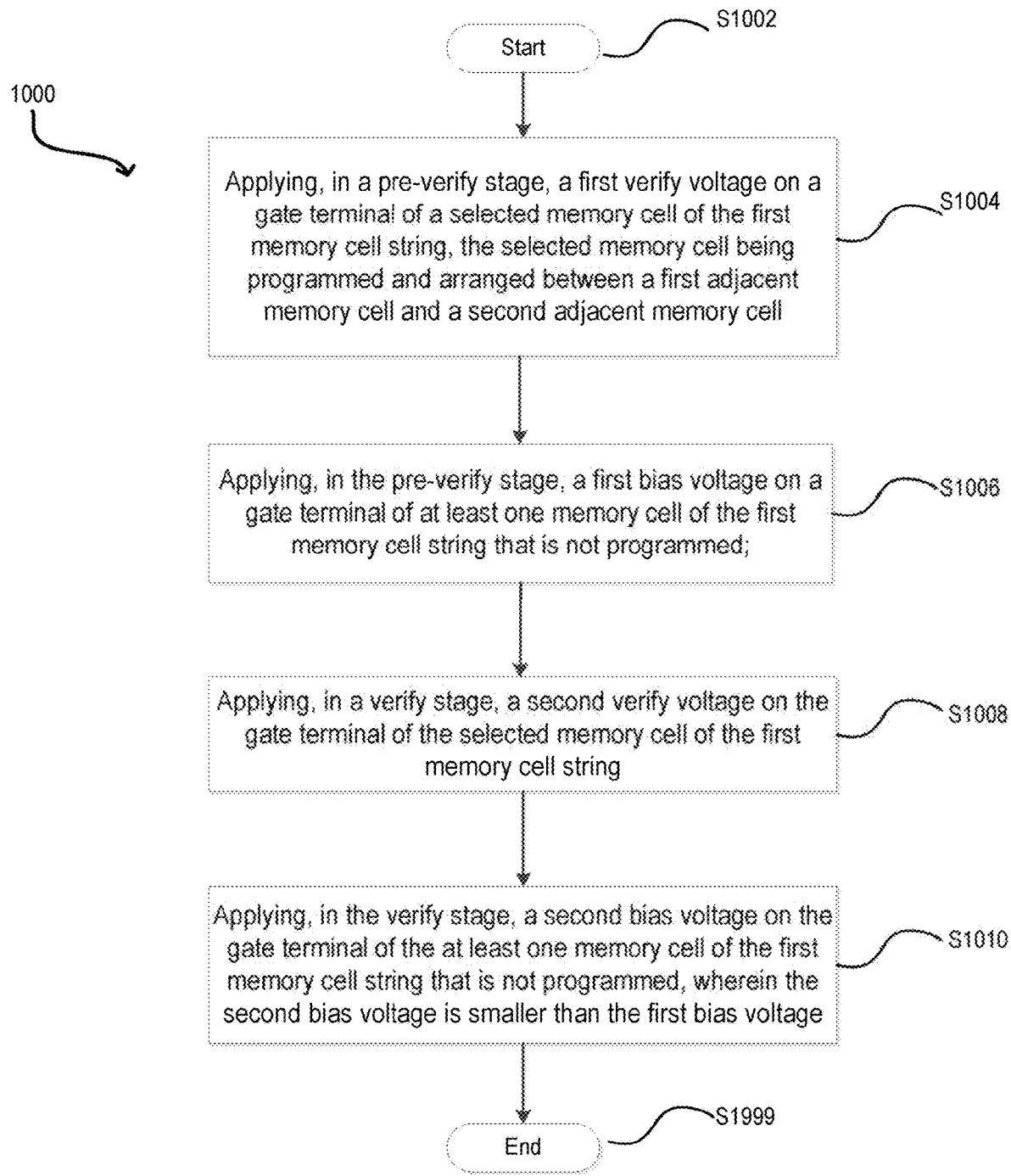
FIG. 10 is a flow chart diagram of a method for verifying/reading memory cells, in accordance with exemplary embodiments of the disclosure.

FIG. 10 is a flow chart diagram of a method 1000 for reading a memory device including a first memory cell string and a second memory cell string. The first memory cell string can include a bottom-select-gate (BSG) transistor, memory cells, and a top-select-gate (TSG) transistor that are connected in series. The second memory cell string can include a BSG transistor, memory cells, and a TSG transistor that are connected in series. As shown in FIG. 10, the method 1000 can start at S1002 and proceed to S1004, where a first verify voltage can be applied on a gate terminal of a selected memory cell of the first memory cell string in a pre-verify stage. The selected memory cell can be programmed and arranged between a first adjacent memory cell and a second adjacent memory cell.

At S1004, a first bias voltage can be applied on a gate terminal of at least one memory cell of the first memory cell string that is not programmed in the pre-verify stage.

At S1006, a second verify voltage can be applied on the gate terminal of the selected memory cell of the first memory cell string in a verify stage.

At S1008 of the method 1000, in the verify stage, a second bias voltage can be applied on the gate terminal of the at least one memory cell of the first memory cell string that is not programmed, where the second bias voltage is smaller than the first bias voltage.

In some embodiments, the at least one memory cell of the first memory cell string that receives the first bias voltage and the second bias voltage can be positioned between the first adjacent memory cell of the selected memory cell and the TSG transistor of the first memory cell string.

In some embodiments, the at least one memory cell of the first memory cell string that receives the first bias voltage and the second bias voltage can be positioned between the second adjacent memory cell of the selected memory cell and the BSG transistor of the first memory cell string.

In the method 1000, in the pre-verify stage, a first gate voltage can be applied on a gate terminal of the TSG transistor of the second memory cell string. A first pass voltage can be applied on a gate terminal of the first adjacent memory cell in the selected memory cell of the first memory cell string. A first read voltage can be applied on a gate terminal of the second adjacent memory cell of the selected memory cell in the first memory cell string. Further, in the verify stage, a second gate voltage can be applied on the gate terminal of the TSG transistor of the second memory cell string. A second pass voltage can be applied on the gate terminal of the first adjacent memory cell of the selected memory cell in the first memory cell string. A second read voltage can be applied on the gate terminal of the second adjacent memory cell in the selected memory cell of the first memory cell string. Further, at least one of the second pass voltage and the second read voltage can be larger than the second gate voltage.

Figure 11:
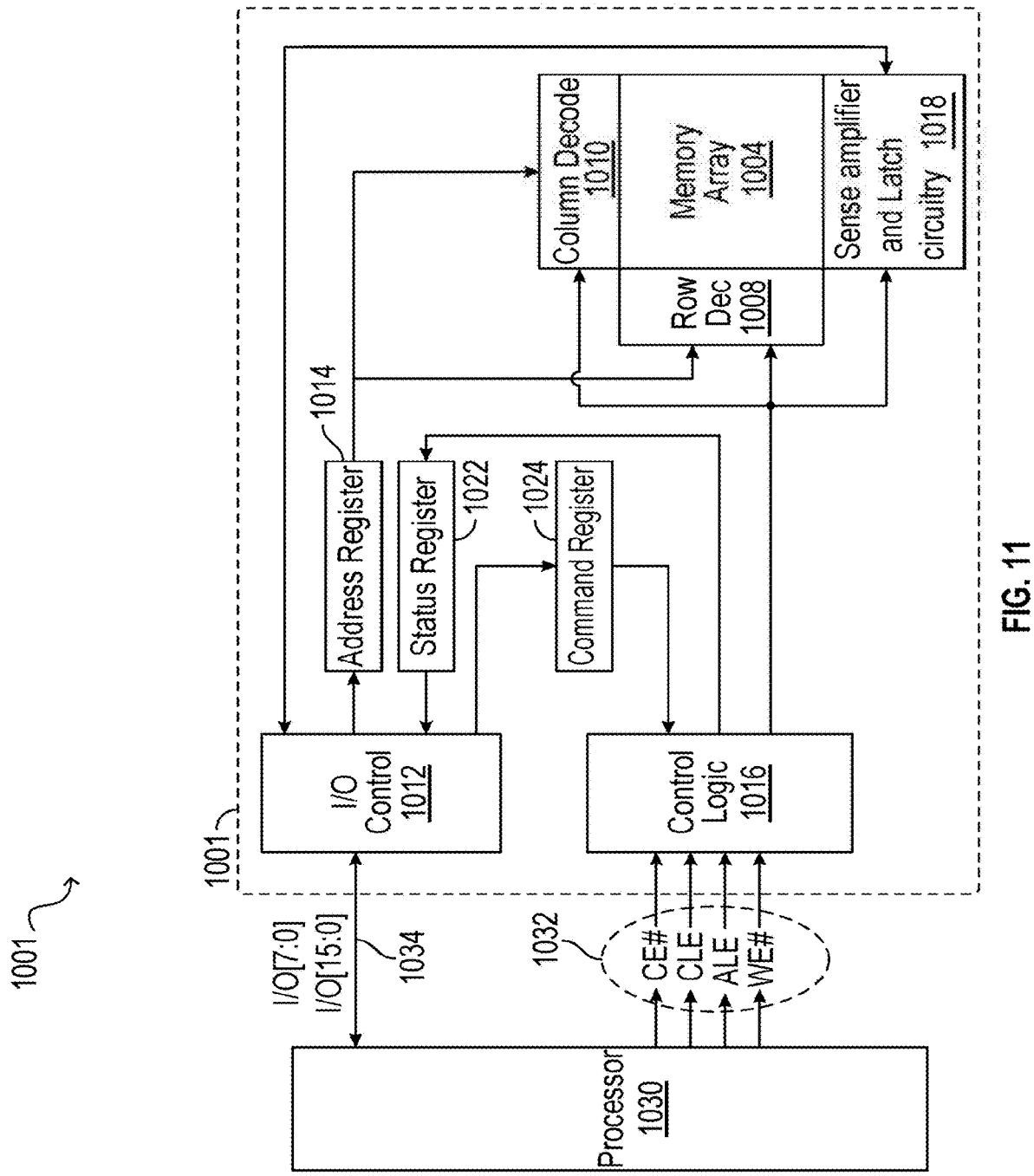
FIG. 11 is a block schematic of an electronic system, in accordance with exemplary embodiments of the disclosure.

FIG. 11 is a simplified block diagram of a memory device 1001 according to an embodiment of the disclosure, and on which various embodiments of the disclosure can be implemented. The memory device 1001 can include a memory array 1004 arranged in rows and columns. The memory array 1004 can include memory cells (e.g., MCs 304 in FIG. 3) that are formed based on a plurality of channel structures (e.g., channel structures 18 in FIG. 2). The channel structures can be formed in a stack of alternating word line layers (e.g., 12 in FIG. 2) and insulating layers (e.g., 14 in FIG. 2). A row decode circuit 1008 and a column decode circuit 1010 are provided to decode address signals provided to the memory device 1001. Address signals are received and decoded to access the memory array 1004. Memory device 1001 can also include an input/output (I/O) control circuit 1012 to manage input of commands, addresses and data to the memory device 1001 as well as output of data and status information from the memory device 1001. An address register 1014 is coupled between the I/O control circuit 1012 and the row decode circuit 1008 and column decode circuit 1010 to latch the address signals prior to decoding. A command register 1024 is coupled between the I/O control circuit 1012 and a control logic 1016 to latch incoming commands.

The control logic 1016 can control access to the memory array 1004 in response to the commands and generate status information for the external processor 1030. The control logic 1016 is coupled to the row decode circuit 1008 and the column decode circuit 1010 to control the row decode circuit 1008 and column decode circuit 1010 in response to the addresses. For example, bias voltages can be applied to selected memory cells by the control logic 1016 through the row decode circuit 1008 and column decode circuit 1010 to operate the selected memory cells, such as reading, writing or erasing the memory cells. The control logic 1016 can be also coupled to sense amplifier and latch circuitry 1018 to control the sense amplifier and latch circuitry 1018 in response to the commands and generate status information for the external processor 1030. The sense amplifier and latch circuitry 1018 can be coupled to the memory array 1004 and can latch data, either incoming or outgoing, in the form of analog voltage levels. The sense amplifier and latch circuitry 1018 can be configured to read signals of the memory cells when the memory cells are operated.

Still referring to FIG. 11, a status register 1022 can be coupled between the I/O control circuit 1012 and the control logic 1016 to latch the status information for output to the external processor 1030. The memory device 1001 receives control signals at control logic 1016 over a control link 1032. The control signals may include a chip enable CE #, a command latch enable CLE, an address latch enable ALE, and a write enable WE #. The memory device 1001 may receive commands in the form of command signals, addresses in the form of address signals, and data in the form of data signals from an external processor over a multiplexed input/output (I/O) bus 1034 and output data to the external processor over the I/O bus 1034.

The various embodiments described herein offer several advantages over methods in related examples to verify/read memory cells of a 3D-NAND memory device that are programmed. In related examples, HCI can be generated between the selected memory cell and one of the adjacent memory cells of the selected memory cell, and result in the ESUM loss. In the present disclosure, hot-carrier injection (HCI)-induced edge summation (ESUM) loss can be prevented, and power consumption during verifying/reading the memory cells of the 3D-NAND memory device can be reduced.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a memory cell string that includes memory cells (MCs) that are connected in series;
    word line layers coupled respectively with the MCs, the word line layers including a selected word line layer coupled to one of the MCs that is selected for a verify or read operation, and an unselected word line layer coupled to one of the MCs that is not selected for the verify or read operation; and
    processing circuitry configured to:
        apply, in a pre-pulse stage, a first verify/read bias voltage on the selected word line layer;
        apply, in the pre-pulse stage, a first bias voltage on the unselected word line layer;
        apply, in a verify/read stage, a second verify/read voltage on the selected word line layer; and
        apply, in the verify/read stage, a second bias voltage on the unselected word line layer, wherein the second bias voltage is smaller than the first bias voltage.

2. The memory device of claim 1, wherein the word line layers include an (n+1)-th word line layer, denoted WLn+1, that is adjacent to and above the selected word line layer that is an n-th word line layer, denoted WLn, and
    the unselected word line layer is positioned between the WLn+1 and a top-select-gate (TSG) transistor connected to the memory cell string.

3. The memory device of claim 1, wherein the word line layers include an (n−1)-th word line layer, denoted WLn−1, that is adjacent to and below the selected word line layer that is an n-th word line layer, denoted WLn, and
    the unselected word line layer is positioned between the WLn−1 and a bottom-select-gate (BSG) transistor connected to the memory cell string.

4. The memory device of claim 1, wherein the processing circuitry is further configured to:
    vary a voltage level of a voltage applied to the unselected word line layer from the first bias voltage to the second bias voltage during a period corresponding to one of:
        a first period of the pre-pulse stage and the verify/read stage, and
        a second period of the pre-pulse stage.

5. The memory device of claim 1, wherein the processing circuitry is further configured to:
    increase, during the pre-pulse stage, a voltage level of a voltage applied to the unselected word line layer from an initial level to the first bias voltage; and
    lower the voltage level of the voltage applied to the unselected word line layer to the second bias voltage applied during the verify/read stage.

6. The memory device of claim 1, wherein the processing circuitry is further configured to:
    increase, during a first portion of the pre-pulse stage, a voltage level of a voltage applied to the unselected word line layer from an initial level to the first bias voltage; and
    lower the voltage level of the voltage applied to the selected word line layer from the first bias voltage to the second bias voltage during the first portion of the pre-pulse stage corresponding to a period in which a voltage applied to a selected TSG connected to the memory cell string increases continuously.

7. The memory device of claim 6, wherein the processing circuitry is further configured to:
    apply a gate voltage with a first gate voltage level on an unselected TSG, and subsequently lower the gate voltage applied on the unselected TSG from the first gate voltage level to a second gate voltage level that is effective to turn off the unselected TSG;
    increase a bias voltage applied on an unselected word line layer that is below the selected word line layer or adjacent to and above the selected word line layer from an initial voltage level to a target voltage level while applying the gate voltage with the first gate voltage level on the unselected TSG layer and subsequently lowering the gate voltage applied on the unselected TSG layer from the first gate voltage level to the second gate voltage level; and
    continue to increase the bias voltage applied on the unselected word line layer that is below the selected word line layer or adjacent to and above the selected word line layer after the gate voltage applied on the unselected TSG layer reaches the second gate voltage level that is effective to turn off the unselected TSG and before the end of the pre-pulse stage.

8. The memory device of claim 7, wherein a voltage increase rate corresponding to increasing a voltage level of a voltage applied to the unselected word line layer from an initial level to the first bias voltage is greater than a voltage increase rate corresponding to increasing the bias voltage applied on the unselected word line layer that is below the selected word line layer or adjacent to and above the selected word line layer from the initial voltage level to the target voltage level.

9. The memory device of claim 6, wherein the processing circuitry is further configured to:
    apply a gate voltage with a first gate voltage level on an unselected TSG, and subsequently lower the gate voltage applied on the unselected TSG from the first gate voltage level to a second gate voltage level that is effective to turn off the unselected TSG;

increase a bias voltage applied on an unselected word line layer that is adjacent to and below the selected word line layer or above the selected word line layer from an initial voltage level to a target voltage level while applying the gate voltage with the first gate voltage level on the unselected TSG layer and subsequently lowering the gate voltage applied on the unselected TSG layer from the first gate voltage level to the second gate voltage level; and continue to increase the bias voltage applied on the unselected word line layer that is adjacent to and below the selected word line layer or above the selected word line layer after the gate voltage applied on the unselected TSG layer reaches the second gate voltage level that is effective to turn off the unselected TSG and before the end of the pre-pulse stage.

10. The memory device of claim 1, wherein a voltage increase rate corresponding to increasing a voltage level of a voltage applied to the unselected word line layer from an initial level to the first bias voltage is greater than a voltage increase rate corresponding to increasing a bias voltage applied on an unselected word line layer that is above the selected word line layer or adjacent to and below the selected word line layer from an initial voltage level to a target voltage level.

11. The memory device of claim 1, wherein the first verify/read bias voltage is lower than the second verify/read voltage.

12. The memory device of claim 1, wherein the processing circuitry is further configured to:
in the pre-pulse stage,
apply a first gate voltage on an unselected TSG transistor,
apply a first pass voltage on a first word line layer of the word line layers adjacent to the selected word line layer, and
apply a second pass voltage on a second word line layer of the word line layers adjacent to the selected word line layer; and
in the verify/read stage,
apply a second gate voltage on the unselected TSG transistor,
apply a third pass voltage on the first word line layer of the word line layers adjacent to the selected word line layer, and
apply a fourth pass voltage on the second word line layer of the word line layers adjacent to the selected word line layer, wherein
at least one of the third pass voltage and the fourth pass voltage is larger than the second gate voltage.

13. The memory device of claim 1, wherein the processing circuitry is further configured to:
apply a bottom bias voltage on a BSG connected to the memory cell string in the pre-pulse stage and the verify/read stage;
apply a top bias voltage on a selected TSG transistor connected to the memory string in the pre-pulse stage and the verify/read stage; and
apply a positive voltage on ones of the word line layers that are positioned between a word line layer of the word line layers that is adjacent to and below the selected word line layer and the BSG transistor in the pre-pulse stage and the verify/read stage.

14. The memory device of claim 1, wherein the processing circuitry is further configured to:

apply a bottom bias voltage on a BSG connected to the memory string in the pre-pulse stage and the verify/read stage;
apply a top bias voltage on a selected TSG transistor connected to the first memory cell string in the pre-pulse stage and the verify/read stage; and
apply a positive voltage on ones of the word line layers that are positioned between a word line layer of the word line layers that is adjacent to and above the selected word line layer and the selected TSG transistor connected to the memory cell string in the pre-pulse stage and the verify/read stage.

15. A method of operating a memory device comprising a memory cell string that includes memory cells (MCs) that are connected in series, and word line layers coupled respectively with the MCs, the word line layers including a selected word line layer coupled to one of the MCs that is selected for a verify or read operation, and an unselected word line layer coupled to one of the MCs that is not selected for the verify or read operation, the method comprising:
applying, in a pre-pulse stage, a first verify/read bias voltage on the selected word line layer;
applying, in the pre-pulse stage, a first bias voltage on the unselected word line layer;
applying, in a verify/read stage, a second verify/read voltage on the selected word line layer; and
applying, in the verify/read stage, a second bias voltage on the unselected word line layer, wherein the second bias voltage is smaller than the first bias voltage.

16. The method of claim 15, wherein the word line layers include an (n+1)-th word line layer, denoted WLn+1, that is adjacent to and above the selected word line layer that is an n-th word line layer, denoted WLn, and
the unselected word line layer is positioned between the WLn+1 and a top-select-gate (TSG) transistor connected to the memory cell string.

17. The method of claim 15, wherein the word line layers include an (n−1)-th word line layer, denoted WLn−1, that is adjacent to and below the selected word line layer that is an n-th word line layer, denoted WLn, and
the unselected word line layer is positioned between the WLn−1 and a bottom-select-gate (BSG) transistor connected to the memory cell string.

18. The method of claim 15, further comprising:
varying a voltage level of a voltage applied to the unselected word line layer from the first bias voltage to the second bias voltage during a period corresponding to one of:
a first period of the pre-pulse stage and the verify/read stage, and
a second period of the pre-pulse stage.

19. The method of claim 15, further comprising:
increasing, during the pre-pulse stage, a voltage level of a voltage applied to the unselected word line layer from an initial level to the first bias voltage; and
lowering the voltage level of the voltage applied to the unselected word line layer to the second bias voltage applied during the verify/read stage.

20. The method of claim 15, further comprising:
increasing, during a first portion of the pre-pulse stage, a voltage level of a voltage applied to the unselected word line layer from an initial level to the first bias voltage; and
lowering the voltage level of the voltage applied to the selected word line layer from the first bias voltage to the second bias voltage during the first portion of the pre-pulse stage corresponding to a period in which a voltage applied to a selected TSG connected to the memory cell string increases continuously.

\* \* \* \* \*